United States Patent
Park et al.

(10) Patent No.: US 8,258,526 B2
(45) Date of Patent: Sep. 4, 2012

(54) LIGHT EMITTING DIODE PACKAGE INCLUDING A LEAD FRAME WITH A CAVITY

(75) Inventors: Young Sam Park, Seoul (KR); Hun Joo Hahm, Gyeonggi-do (KR); Hyung Suk Kim, Gyeonggi-do (KR); Seong Yeon Han, Gwangju-si (KR); Do Hun Kim, Seoul (KR); Dae Yeon Kim, Gyeonggi-do (KR); Dae Hyun Kim, Ulsan-si (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 383 days.

(21) Appl. No.: 12/204,260

(22) Filed: Sep. 4, 2008

(65) Prior Publication Data
US 2010/0001306 A1 Jan. 7, 2010

(30) Foreign Application Priority Data
Jul. 3, 2008 (KR) ........................ 10-2008-0064367

(51) Int. Cl.
*H01L 33/00* (2010.01)
(52) U.S. Cl. .............................. 257/98; 257/99; 257/100
(58) Field of Classification Search .................... 257/98, 257/99, 100
See application file for complete search history.

(56) References Cited

U.S. PATENT DOCUMENTS

| | | | | |
|---|---|---|---|---|
| 5,750,421 | A * | 5/1998 | Kasai et al. | 438/106 |
| 6,472,765 | B1 * | 10/2002 | Sano et al. | 257/787 |
| 6,476,469 | B2 * | 11/2002 | Hung et al. | 257/676 |
| 6,559,379 | B2 * | 5/2003 | Solanki et al. | 174/533 |
| 6,774,447 | B2 * | 8/2004 | Kondo et al. | 257/432 |
| 7,078,734 | B2 * | 7/2006 | Hiramoto | 257/98 |
| 7,080,933 | B2 | 7/2006 | Chen et al. | |
| 7,186,013 | B2 | 3/2007 | Jeong et al. | |
| 7,188,988 | B2 | 3/2007 | Koganezawa | |
| 7,208,772 | B2 * | 4/2007 | Lee et al. | 257/99 |
| 7,413,334 | B2 | 8/2008 | Baba | |
| 2003/0107316 | A1 | 6/2003 | Murakami et al. | |
| 2004/0008952 | A1 | 1/2004 | Kragl | |
| 2004/0065894 | A1 * | 4/2004 | Hashimoto et al. | 257/100 |
| 2005/0280017 | A1 * | 12/2005 | Oshio et al. | 257/99 |
| 2006/0054912 | A1 * | 3/2006 | Murakami et al. | 257/99 |
| 2007/0080337 | A1 | 4/2007 | Sorg | |
| 2007/0145403 | A1 * | 6/2007 | Tomioka et al. | 257/99 |

(Continued)

FOREIGN PATENT DOCUMENTS

JP 2001-185763 A 7/2001

(Continued)

OTHER PUBLICATIONS

Korean Office Action, with English translation, issued in Korean Patent Application No. 10-2009-0060886, mailed Mar. 14, 2011.

(Continued)

*Primary Examiner* — Marcos D. Pizarro
*Assistant Examiner* — Bilkis Jahan
(74) *Attorney, Agent, or Firm* — McDermott Will & Emery LLP

(57) ABSTRACT

The present invention provides a light emitting diode package which includes a lead frame with a cavity; a mold exposing the cavity and housing the lead frame; and an LED chip mounted on the cavity, wherein light passing an upper edge of the LED chip passes an upper edge of the cavity.

7 Claims, 2 Drawing Sheets

U.S. PATENT DOCUMENTS

| | | | |
|---|---|---|---|
| 2008/0048201 A1* | 2/2008 | Kim et al. | 257/98 |
| 2008/0121921 A1* | 5/2008 | Loh et al. | 257/99 |
| 2008/0266896 A1 | 10/2008 | Chang | |
| 2009/0273732 A1 | 11/2009 | Shimura et al. | |
| 2009/0273733 A1 | 11/2009 | Shimura et al. | |
| 2009/0316074 A1 | 12/2009 | Tomiyoshi | |

FOREIGN PATENT DOCUMENTS

| | | |
|---|---|---|
| JP | 2001-511956 A | 8/2001 |
| JP | 2003-152225 A | 5/2003 |
| JP | 2003-174200 A | 6/2003 |
| JP | 2004-520612 A | 7/2004 |
| JP | 2006-080251 | 3/2006 |
| JP | 2006-237141 A | 9/2006 |
| JP | 2006-287032 A | 10/2006 |
| JP | 2007-096325 | 4/2007 |
| KR | 10-0634189 B1 | 10/2006 |
| KR | 10-0719282 | 5/2007 |
| KR | 10-2007-0098193 A | 10/2007 |
| KR | 10-2007-0104149 A | 10/2007 |
| WO | WO 99/31738 | 6/1999 |
| WO | WO 2007/073062 A1 | 6/2007 |

OTHER PUBLICATIONS

International Preliminary Report on Patentability and Written Opinion of the International Searching Authority, with English Translation, issued in International Patent Application No. PCT/KR2009/003659, mailed Mar. 2, 2011.

Japanese Office Action, w/ English translation thereof, issued in Japanese Patent Application No. 2008-241769, dated Sep. 13, 2011.

* cited by examiner

[FIG. 1]
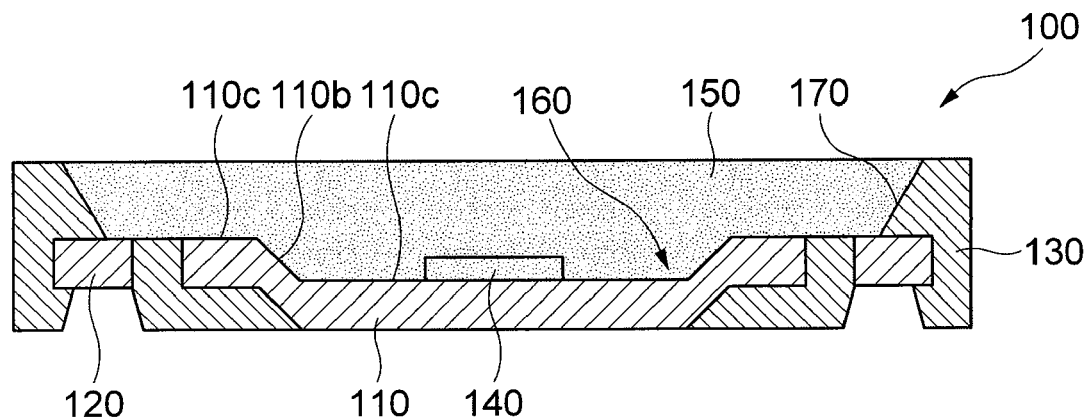
[FIG. 2]
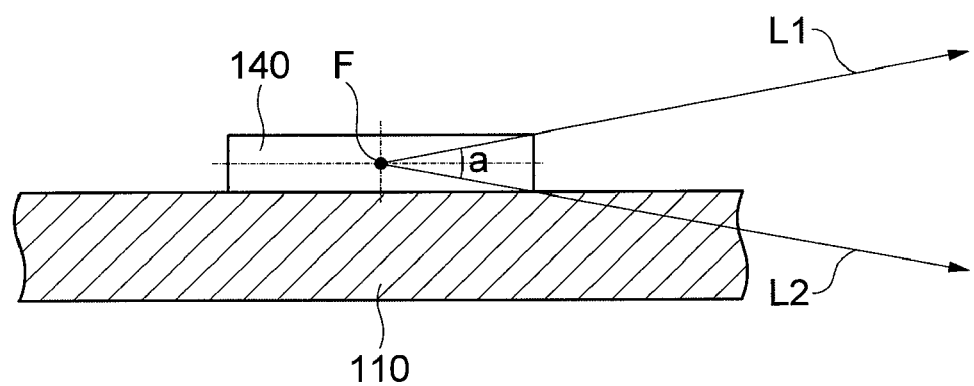
[FIG. 3]
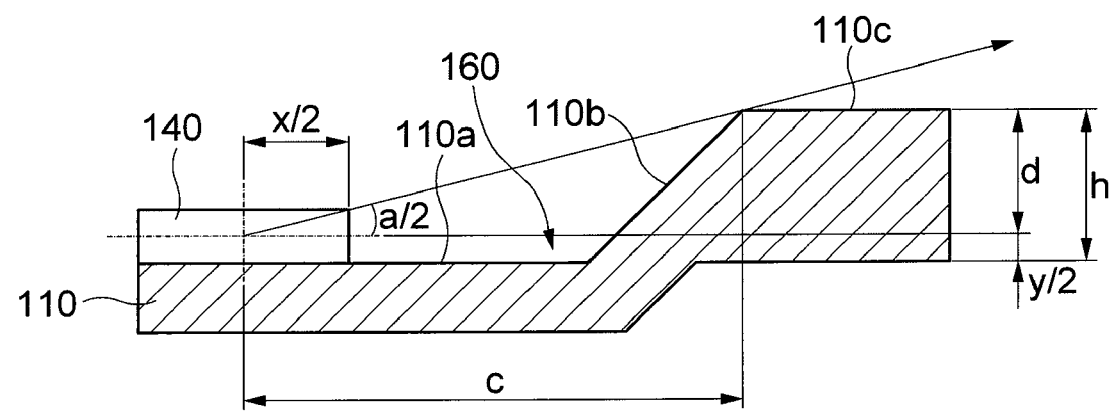

[FIG. 4]
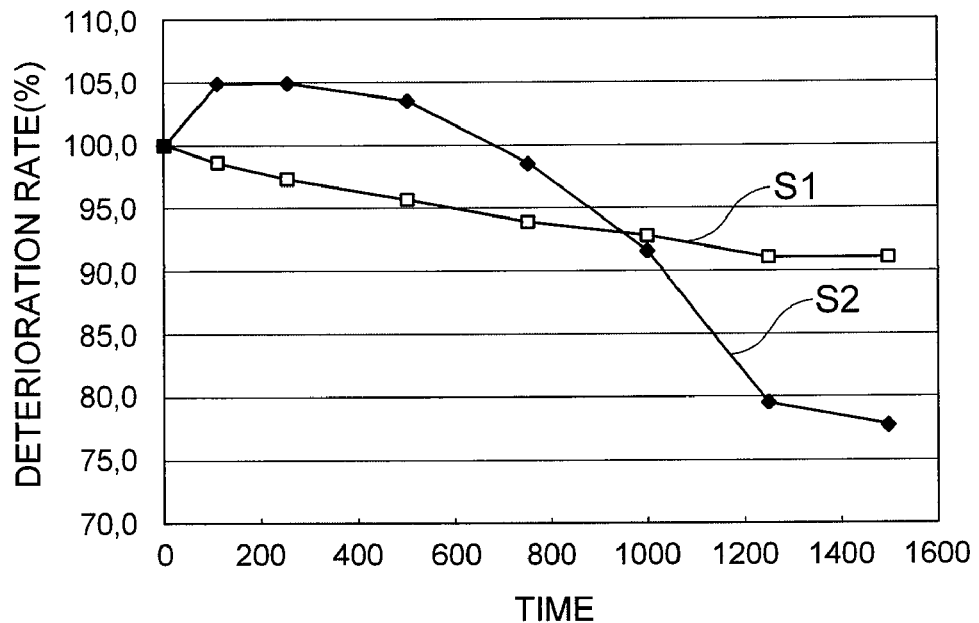
[FIG. 5]
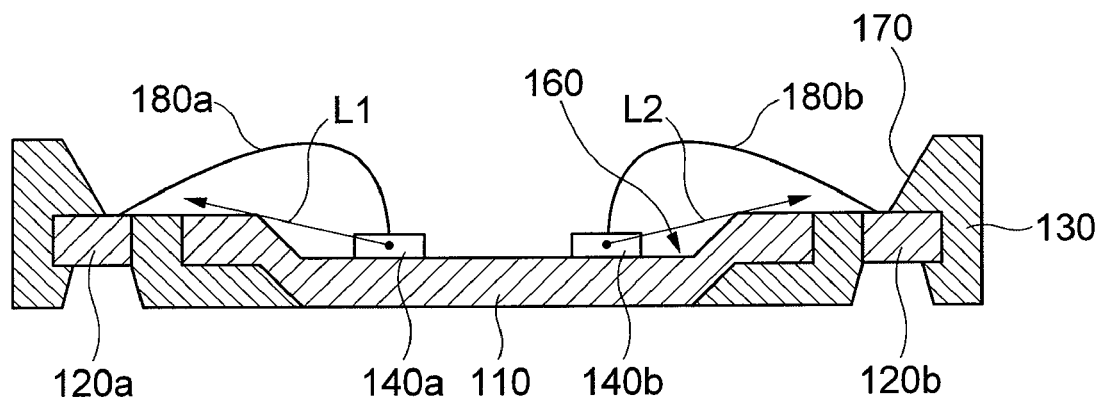

LIGHT EMITTING DIODE PACKAGE INCLUDING A LEAD FRAME WITH A CAVITY

CROSS-REFERENCE TO RELATED APPLICATIONS

This application claims the benefit of Korean Patent Application No. 10-2008-0064367 filed with the Korea Intellectual Property Office on Jul. 3, 2008, the disclosure of which is incorporated herein by reference.

BACKGROUND OF THE INVENTION

1. Field of the Invention

The present invention relates to a light emitting diode package, and more particularly, to a light emitting diode package capable of improving reliability.

2. Description of the Related Art

As a light emitting diode has various advantages a long lifespan, low consumption power, rapid response speed, an excellent drive property in comparison with a light emitting device based on a filament, the light emitting diode is widely applied to a lighting apparatus, an electric signboard, an electronic appliance, for example, a backlight of a display device. In addition, the light emitting diode can be downsized and light-weighted, applications of the light emitting diode are increasingly extended.

The light emitting diode is used in a package type. That is, a light emitting diode package includes a light emitting diode chip, a lead frame mounted with the light emitting diode chip, and a mold receiving the lead frame and exposing the light emitting diode chip. Herein, the mold is provided with the light emitting diode and a cavity allowing a part of the lead frame to be exposed so as to efficiently emit heat generated from the light emitting diode chip. At this time, although light generated from the light emitting diode chip is emitted upwards, a part of the light generated from the light emitting diode chip, that is, light emitted from a side surface of the light emitting diode chip may be irradiated onto a side wall of the cavity. At this time, the light irradiated onto the side wall, that is, the mold deteriorates the mold, thereby lowering reliability of the light emitting diode package. In particular, as an output of the light emitting diode chip becomes higher, the deterioration of the mold is accelerated, whereby there is a limit in applying the light emitting diode package to a high-output light emitting diode package.

Accordingly, a conventional light emitting diode package has a problem in that the mold is deteriorated due to the light generated from the light emitting diode chip, thereby lowering the reliability of the light emitting diode package.

SUMMARY OF THE INVENTION

An object of the present invention is to provide a light emitting diode package capable of preventing reliability from being lowered due to deterioration of a mold by preventing light generated from a light emitting diode chip to the mold from being irradiated with a lead frame having a cavity for mounting the light emitting diode chip.

In order to achieve the above-described object, there is a provided a light emitting diode package in accordance with an aspect of the present invention which includes a lead frame with a cavity; a mold exposing the cavity and housing the lead frame; and an LED chip mounted on the cavity, wherein light passing an upper edge of the LED chip passes an upper edge of the cavity.

Herein, a depth of the cavity is designed to satisfy the following Equation 1.

$$h = y/x \times c + y/2$$ Equation 1

Herein, H is the depth of the cavity, x is a width of the LED chip, y is a height of the LED chip, and c is a width of the cavity.

The lead frame includes a bottom surface, a lateral wall surface extending upward to be inclined from the bottom surface, and a horizontal surface horizontally extending from the lateral wall surface.

The upper edge of the cavity is an area where the lateral wall surface and the horizontal surface are in contact with each other.

The light emitting diode package may include a reflective film covering the lead frame.

The LED chip may be provided in the cavity in plural numbers such as one or two or more.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a light emitting diode package in accordance with a first embodiment of the present invention;

FIG. 2 is a diagram illustrating an optical characteristic of an LED (Light Emitting Diode) chip shown in FIG. 1;

FIG. 3 is a diagram illustrating a design of a lead frame in accordance with a first embodiment of the present invention;

FIG. 4 is a graph illustrating a high-temperature reliability test result performed for a light emitting diode package in accordance with a type of a lead frame; and FIG. 5 is a cross-sectional view of a light emitting diode package in accordance with a second embodiment of the present invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

FIG. 1 is a cross-sectional view of a light emitting diode package in accordance with a first embodiment of the present invention.

Referring to FIG. 1, a light emitting diode package 100 includes an LED chip 140, lead frames 110 and 120, and a mold 130.

The LED chip 140 may be a semiconductor device emitting light by an applied current. The LED chip 140 may be a rectangular parallelepiped light source. However, in this embodiment of the present invention, the LED chip 140 is not limited to the rectangular parallelepiped light source. That is, the LED chip 140 may have various shapes such as a regular hexahedron and a trapezoid hexahedron.

The lead frames 110 and 120 may include a first lead unit 110 and a second lead unit 120 which are separated from each other. At this time, the first lead unit 110 includes a bottom surface 110a mounted with the LED chip 140, a lateral wall surface 110b extending upward to be inclined from the bottom surface 110a, and a horizontal surface 110c horizontally extending from the lateral wall surface 110b. Hence, the first lead unit 110 forms a cavity 160 by the bottom surface 110a and the lateral wall surface 110b. That is, the LED chip 140 is mounted within the cavity 160. Herein, although not shown in the figure, the LED chip 140 may be electrically connected to the bottom surface 110a by a conductive member, for example, a solder ball or a wire. At this time, the second lead unit 120 and the LED chip 140 may be electrically connected to each other by the wire.

The mold 130 houses the lead frames 110 and 120. At this time, the mold 130 includes an opening portion 170 for exposing the cavity 160 including the LED chip 140. That is, the mold 130 exposes the bottom surface 110a and the lateral wall surface 110b at least. In addition, the mold 130 may further expose the second lead frame 120. Accordingly, heat generated from the LED chip 140 may efficiently be discharged. Herein, a part of the lead frame, for example, a part of the horizontal surface 110c may be exposed by being drawn to an outside with penetrating the mold 130.

The mold 130 may efficiently discharge the heat generated from the LED chip 140 by exposing rear surfaces of the lead frames 110 and 120.

It is possible to prevent light generated from the LED chip 140 from being radiated to the mold 130 by stably design a length of the cavity 160. As a result, it is possible to prevent the reliability of the light emitting diode package 100 from being lowered due to deterioration of the mold 130. This will hereinafter be described in more detail.

Further, a sealing member 150 may further be provided in an opening portion 170 of the mold 130. Herein, the sealing member 150 may have a single layer structure. Contrary to this, the sealing member 150 may have a double layer structure having different refractive indexes. At this time, in order to efficiently discharge the light generated from the LED chip 140 to the outside, a lower layer of the sealing member 150 may have a refractive index smaller than an upper layer of the sealing member 150.

Although not shown in the figure, a reflective film for increasing reflectivity of the light may further be provided on surfaces of the lead frames 110 and 120. The reflective film may be made of a metal having high light reflectivity. For example, a material of the reflective film may be Ag or Al. Herein, the reflective film may be formed by a plating method. Accordingly, it is possible to further increase light extraction efficiency of the light emitting diode package 100.

Hereinafter, referring to FIGS. 2 and 3, a preferred design of a cavity in accordance with an embodiment of the present invention will be described in more detail.

FIG. 2 is a diagram illustrating an optical characteristic of the LED chip shown in FIG. 1.

As shown in FIG. 2, the LED chip 140 may be a rectangular parallelepiped light source. At this time, in case that a current is applied to the LED chip 140, the light generated from the LED chip 140 may be discharged through a top surface and a lateral surface of the LED chip 140. Herein, light formed in a center F of the LED chip 140 is discharged through the lateral surface of the LED chip 140, the light may be distributed between an angle of first light L1 passing an upper edge of the LED chip 140 and an angle a of second light L2. At this time, Lights directed toward lower parts of the lead frames 110 and 120 among lights generated from the lateral surface of the LED chip 140 are reflected and discharged toward an upper parts of the lead frames 110 and 120. However, some of the lights directed toward the upper parts of the lead frames 110 and 120 among the lights generated from the lateral surface of the LED chip 140 are radiated to the mold 130, causing the mold 130 to be deteriorated. At this time, it is possible to prevent the lights generated from the lateral surface of the LED chip 140 from being radiated to the mold 130 by adjusting a depth of the cavity 160. Herein, it is preferable to adjust the depth of the cavity 160 so that the first light L1 passes the upper edge of the cavity 160. As a result, most of the lights generated from the lateral surface of the LED chip 140 may be radiated to the lateral wall surface 110b of the lead frames 110 and 120. This is a reason why the light passing the upper edge of the LED chip 140, that is, the first light L1 is outermost light discharged from the lateral surface of the LED chip 140. Herein, the upper edge of the cavity 160 is an area where the lateral wall surface 110b and the horizontal surface 110c are in contact with each other.

FIG. 3 is a diagram illustrating a design of a lead frame in accordance with a first embodiment of the present invention.

As shown in FIG. 3, the depth of the cavity should satisfy the following Equation 2.

$$h = d + y/2 \qquad \text{Equation 2}$$

Herein, h is the depth of the cavity 160. d is a length of an area where the lights discharged to the upper parts of the lead frames 110 and 120 among the lights generated from the lateral wall surface 110b of the LED chip 140 can be radiated to the lateral wall surface of the lead frames 110 and 120. y is a height of the LED chip 140.

At this time, the length d of the area where the light is radiated to the lateral wall surface of the lead frames 110 and 120 can be acquired by the following Equation 3.

$$\tan(a/2) = y/x = d/c, \text{ thereby } d = y/x \times c \qquad \text{Equation 3}$$

Herein, x is a width of the LED chip 140. c is a width of the cavity 160.

Accordingly, the depth h of the cavity 160 satisfies the following Equation 1.

$$h = y/x \times c + y/2 \qquad \text{Equation 1}$$

Herein, h is a depth of the cavity 160. x is the width of the LED chip 140. y is the height of the LED chip 140. c is the width of the cavity 160.

FIG. 4 is a graph illustrating a high-temperature load reliability test result performed for a light emitting diode package in accordance with a type of a lead frame.

As shown in FIG. 4, it is verified that a light emitting diode package S1 including a lead frame with a cavity has deterioration rate smaller than a light emitting diode package S2 having a flat lead frame.

Accordingly, in case that the cavity is provided in the lead frame, it is possible to prevent the mold from being deteriorated due to light generated from the LED chip. In addition, it is possible to more effectively prevent the mold from being deteriorated by stably designing the depth of the cavity.

FIG. 5 is a cross-sectional view of a light emitting diode package in accordance with a second embodiment of the present invention. Herein, except for the number of the LED chips, the light emitting diode package in accordance with the second embodiment of the present invention has the same configuration as the light emitting diode package in accordance with the first embodiment of the present invention. Accordingly, like reference numerals refer to the same elements in the second embodiment as the elements in the first embodiment and repetitive description will be omitted.

Referring to FIG. 5, the light emitting diode package in accordance with the present invention lead frames 110, 120a, and 120b having the cavity 160, a mold 130 exposing the cavity 160 and housing the lead frame 110, and LED chips 140a and 140b mounted on the cavity 160. Herein, in order to prevent the mold 130 from being deteriorated due to light generated from lateral surfaces of the LED chips 140a and 140b, the cavity 160 is designed so that light passing upper edges of the LED chips 140a and 140b passes an upper edge of the cavity 160.

The lead frames 110, 120a, and 120b may include a first lead unit 110 mounted with the LED chips 140a and 140b, and second and third lead units 120a and 120b which are spaced from the first lead unit 110 and are electrically insulated from each other. At this time, the cavity 160 is formed in the first lead unit 110.

The LED chips 140a and 140b may include a first LED chip 140a and a second LED chip 140b which are provided in the first lead unit 110, that is, the cavity 160. Herein, the first and second LED chips 140a and 140b are the same as each other or can implement lights of different colors.

The first and second LED chips 140a and 140b may be electrically connected to the first lead unit 110. With this, the first LED chip 140a is electrically connected to the second lead unit 120a through a first wire 180a. The second LED chip 140b is electrically connected to a third lead unit 120b through a second wire 180b.

In this embodiment of the present invention, an example that two LED chips are mounted has been described, but is not limited to it. Two or more LED chips may mounted by adjusting the number of the lead units.

Accordingly, the number of the LED chips mounted on the lead frame can be selectively selected by adjusting the number of the lead units which are electrically insulated from each other.

A light emitting diode device has a lead frame having a cavity for mounting a chip and thus light generated from a light emitting diode chip is prevented from being radiated to a mold, whereby there is provided a light emitting diode package capable of preventing reliability from being lowered due to deterioration of the mold.

Since it is possible to prevent the deterioration due to the light radiated to the mold, a high-output light emitting diode chip can be applied.

The mold exposes the lead frame mounted with the light emitting diode chip, thereby efficiently discharging heat generated from the light emitting diode chip.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A light emitting diode package comprising:
   a lead frame with a cavity;
   a mold exposing the entire cavity and housing the lead frame; and
   an LED (Light Emitting Diode) chip mounted on the cavity,
   wherein the lead frame reflects light discharged from lateral surfaces of the LED chip, and light passing an upper edge of the lateral surface of the LED chip passes an upper edge of the cavity,
   wherein the cavity has a depth to prevent light discharged from the lateral surfaces of the LED chip from radiating to the mold, and the depth of the cavity satisfies the following Equation 1;

$$h = y/x \times c + y/2 \qquad \text{Equation 1}$$

where h is the depth of the cavity, x is the width of the LED chip, y is a height of the LED chip, and c is a width of the cavity.

2. The light emitting diode package according to claim 1, wherein the lead frame includes a bottom surface, a lateral wall surface extending upward to be inclined from the bottom surface, and a horizontal surface horizontally extending from the lateral wall surface.

3. The light emitting diode package according to claim 2, wherein the upper edge of the cavity is an area where the lateral wall surface and the horizontal surface are in contact with each other.

4. The light emitting diode package according to claim 1, further comprising:
   a reflective film covering the lead frame.

5. The light emitting diode package according to claim 1, wherein the LED chip is provided in the cavity in plural numbers such as one or two or more.

6. The light emitting diode package according to claim 1, wherein the mold exposes a rear surface of the lead frame.

7. The light emitting diode package according to claim 1, wherein the mold surrounds an outer circumference of the lead frame and the upper edge of the mold is located below a trajectory extending from the upper edge of the lateral surface of the LED chip to the innermost upper edge of the cavity space.

* * * * *